United States Patent [19]

Meckel et al.

[11] 4,324,631
[45] Apr. 13, 1982

[54] MAGNETRON SPUTTERING OF MAGNETIC MATERIALS

[75] Inventors: Benjamin B. Meckel; Emily I. Bromley, both of Del Mar, Calif.

[73] Assignee: Spin Physics, Inc., San Diego, Calif.

[21] Appl. No.: 59,932

[22] Filed: Jul. 23, 1979

[51] Int. Cl.³ .............................................. C23C 15/00
[52] U.S. Cl. .................................. 204/192 M; 204/298
[58] Field of Search ............... 204/192 R, 192 M, 298

[56] References Cited

U.S. PATENT DOCUMENTS

| | | | |
|---|---|---|---|
| 3,718,572 | 2/1973 | Robinson et al. | 204/298 |
| 3,956,093 | 5/1976 | McLeod | 204/192 |
| 4,060,470 | 11/1977 | Clarke | 204/192 R |
| 4,094,761 | 6/1978 | Wilson | 204/192 M |

OTHER PUBLICATIONS

B. I. Bertelsen, Sputtering Cathode For Magnetic Film Deposition, IBM Technical Disclosure Bulletin, vol. 6, No. 2 Jul., 1963, pp. 69-70.

J. L. Vossen and W. Kerr, editors, Thin Film Processes, Academic Press, New York, 1978 pp. 31, 32.

R. D. Bland, Substrate Heater for Bias Sputtering and Ion Plating Applications, J. Vac. Sci. Technol., vol. 11, No. 5 pp. 906-907.

Primary Examiner—Delbert E. Gantz
Assistant Examiner—William Leader
Attorney, Agent, or Firm—Robert F. Cody

[57] ABSTRACT

The advantages of magnetron sputtering are applied to magnetic target materials by substantially reducing the saturation magnetization of the target material temporarily, and magnetron sputtering the magnetic material while in such a state of reduced magnetization. A technique is disclosed for using the thermal energy inherent in the sputtering process for initially heating the target material to its Curie temperature, thereby rendering the material non-magnetic; and for maintaining the target temperature at or above such temperature during the sputtering process.

10 Claims, 5 Drawing Figures

MAGNETRON SPUTTERING OF MAGNETIC MATERIALS

CROSS-REFERENCE TO RELATED APPLICATIONS

Reference is made to the commonly assigned U.S. application Ser. No. 059,817, filed concurrently herewith in the name of B. B. Meckel entitled MAGNETIC TARGET PLATE FOR USE IN MAGNETRON SPUTTERING FILMS.

BACKGROUND OF THE INVENTION

The present invention relates to an improved method and apparatus for depositing films of magnetic materials on a receiving substrate using the magnetron sputtering technique.

Sputtering is a well-known and widely accepted technique for depositing thin films of a desired material on a substrate. In the basic sputtering process, a target comprising the material to be deposited is bombarded by gas ions, typically argon ions, accelerated by an intense electric field. Such ion bombardment is carried out in a vacuum chamber and serves to eject, via momentum transfer, atomic sized particles from the target in all directions. Some of these particles traverse the vacuum chamber and deposit upon the substrate surface as a thin film. In order to prevent the target material from overheating during the sputtering process, conventional sputtering systems typically comprise some means of cooling the target to a relatively low temperature.

By its nature, the basic sputtering process is slow and inefficient compared with other deposition techniques; that is to say, the sputtered film accumulates at a relatively slow rate, say, 1-3 micrometers per hour, and the electric power required to produce a sputtered film is relatively high. Further, there is a tendency for the substrate to overheat and suffer radiation damage due to the lengthy film-growing procedure and the high energy of the sputtered particles and electrons.

In recent years, the above disadvantages associated with the sputtering process have been alleviated to a major extent by the development of the magnetron. Such a device comprises an elongated array of permanent magnets which is positioned behind the plane of the target material during the sputtering process. When the target is non-magnetic, magnetic lines of force emanating from the magnets pass through the target and extend into the region of the gas plasma produced by the electric field. These magnetic lines of force extend parallel to the target surface and, hence, perpendicular to the plasma-producing electric field. In cooperating with the electric field, the magnetic field above the target surface confines secondary electrons ejected from the target to the vicinity of the target surface and imparts a spiral motion thereto, thereby increasing the number of collisions such electrons have with the gas molecules of the plasma. The result in a densification of the gas plasma in the vicinity of the target surface which, in turn, acts to intensify the ion bombardment of the target and to ultimately increase the normal deposition rate by up to an order of magnitude.

While the magnetron has been used with great success in the sputtering of non-magnetic materials to produce non-magnetic films, the same cannot be said of its use in the formation of magnetic films. In attempting to magnetron sputter material from a magnetic target, one finds that the target acts as a shunt to the magnetic field lines emanating from the magnetron. Thus, the field lines which ordinarily penetrate the non-magnetic target and serve to densify the plasma near the target surface are, in effect, short-circuited through the magnetic target material and are thereby prevented from entering the region of the plasma.

While considerable thought, time and effort have been given by those skilled in the art toward providing a solution to the above-identified problem of magnetron sputtering of magnetic materials, only limited success has been achieved to date. One solution has been to use a very thin magnetic target, one so thin as to be incapable of shunting the entire magnetic field of the magnetron. Such an approach has the effect of forcing some of the magnetic flux outside the plane of the target surface and into the plasma region. The major problems with this approach, however, are that the target is relatively expensive to prepare and, owing to its thin dimension, is rapidly depleted before any substantial film can be accumulated on the receiving substrate. Another solution has been to modify the position and geometry of the permanent magnets of the magnetron. The idea is to produce a magnetic field at the surface of its target by using magnets which are spaced above and/or outside the plasma region of the vacuum chamber. This technique, however, produces a non-uniform deposition; moreover, it is difficult, at best, to produce a magnetic field of sufficient intensity at the target surface. To date, neither of these approaches has been capable of producing a sputter-deposited magnetic layer at a rate which compares favorably to the rate at which non-magnetic materials can be deposited.

In U.S. Pat. No. 4,094,761, issued to R. W. Wilson, there is disclosed a method for the magnetron sputtering of ferromagnetic material. It will be noted, however, that the object of the process disclosed is merely to provide a sputtered layer which contains a ferromagnetic material, e.g. nickel; it is not to provide a sputtered layer having magnetic properties and, in fact, the sputtered layer provided by Wilson's method is non-magnetic at room temperature. According to Wilson's method, an alloy of the desired ferromagnetic material is prepared, such alloy retaining certain desired non-magnetic characteristics and having a Curie temperature below the temperature maintained by the target prior to the sputtering process, i.e. room temperature. Upon producing the desired alloy, this alloy is used as the target material in the conventional magnetron sputtering process. Because the ferromagnetic alloy is, by design, non-magnetic at room temperature, it does not present the aforedescribed shunting problems associated with magnetic target materials.

SUMMARY OF THE INVENTION

In view of the foregoing, it is the primary object of the present invention to provide an improved method for forming magnetic layers using the magnetron sputtering technique.

Another object of the invention is to provide an improved apparatus for magnetron sputtering of magnetic material.

According to the invention, it has been found that magentic target materials can magnetron sputtered to produce magnetic films at the same deposition rates as those obtainable in the magnetron sputtering of non-magnetic materials by rendering the magnetic target material temporarily non-magnetic (or, at least, by substantially reducing the saturation magnetization of the material) during the sputtering process. According to the preferred embodiment of the invention, such temporary demagnetization of the magnetic target material is effected by heating selected areas of the target material to a level substantially equal to or exceeding the Curie temperature of the material. The effect of this heating is to render the heated areas of the target non-magnetic and thereby allow the magnetic field from the magnetron to extend through and above the target surface. While in a non-magnetic state, the target material is magnetron sputtered to deposit a layer of the sputtered material on a substrate space therefrom. The deposited layer exhibits substantially the same magnetic properties as those exhibited by the target material before and after such material is heated. It should be noted that such heating of the target material is contrary to the prior art teachings that the target material in a sputtering system should be maintained at a relatively low temperature during the sputtering operation.

To heat the magnetic target material to its Curie point, external sources of thermal energy (e.g. infrared energy-emitting lamps and/or resistance heaters) may be used; however, it is preferred to make use of the thermal energy inherently generated by the sputtering process. To do this, the sputtering apparatus is initially operated in the conventional diode mode, whereby a relatively rarified plasma is produced in the vicinity of the target surface. Ions from the plasma are accelerated by the plasma-producing electric field to cause ion bombardment and, hence, heating of the entire target. Those portions of the target which are to undergo the intense ion bombardment associated with magnetron sputtering are thermally isolated to allow the temperature of such areas to reach the Curie point. Thermally conductive spacers are used to connect other portions of the target material to the magnetron housing to dissipate heat from the target and thereby prevent overheating.

To maintain the heated portions of the target material at or above the Curie temperature, the temperature of the target is continually monitored by a temperature-sensing device, and the flow of a fluid coolant which flows in thermal communication with the target (e.g. through the magnetron housing) is controlled by a thermostat.

A preferred apparatus of the invention comprises a magnetron sputtering system and means for substantially reducing, temporarily, the saturation magnetization of a magnetic target material which is to be magnetron sputtered in such a system. Preferably, the means for substantially reducing the saturation magnetization of the magnetic target comprises means for heating the target to a temperature substantially equal to or above its Curie point, thereby rendering the target non-magnetic.

The invention and its advantages will be better understood from the ensuing detailed description of preferred embodiments, reference being made to the accompanying drawings.

DETAILED DESCRIPTION OF PREFERRED EMBODIMENTS

In the ensuing description of preferred embodiments, the magnetron sputtering apparatus is described as being of the so-called "planar" magnetron variety. However, those skilled in the art will readily appreciate that the particular geometry of the magnetic elements of the magnetron apparatus has no substantive effect on the operation of the invention and that the invention has utility in other types of magnetron sputtering apparatus, such as "cylindrical" and "post" magnetron sputtering systems of the type disclosed in Thin Film Processes, by J. L. Vossen and W. Kern, Academic Press, New York, 1978. Moreover, it will be appreciated that the expression "magnetic material" as used herein describes both materials which exhibit magnetic properties prior to being used in to-be-described sputtering apparatus, as well as virgin materials which are readily magnetizable and which, in fact, become magnetized when subjected to the magnetic field of a magnetron.

Figure 1:
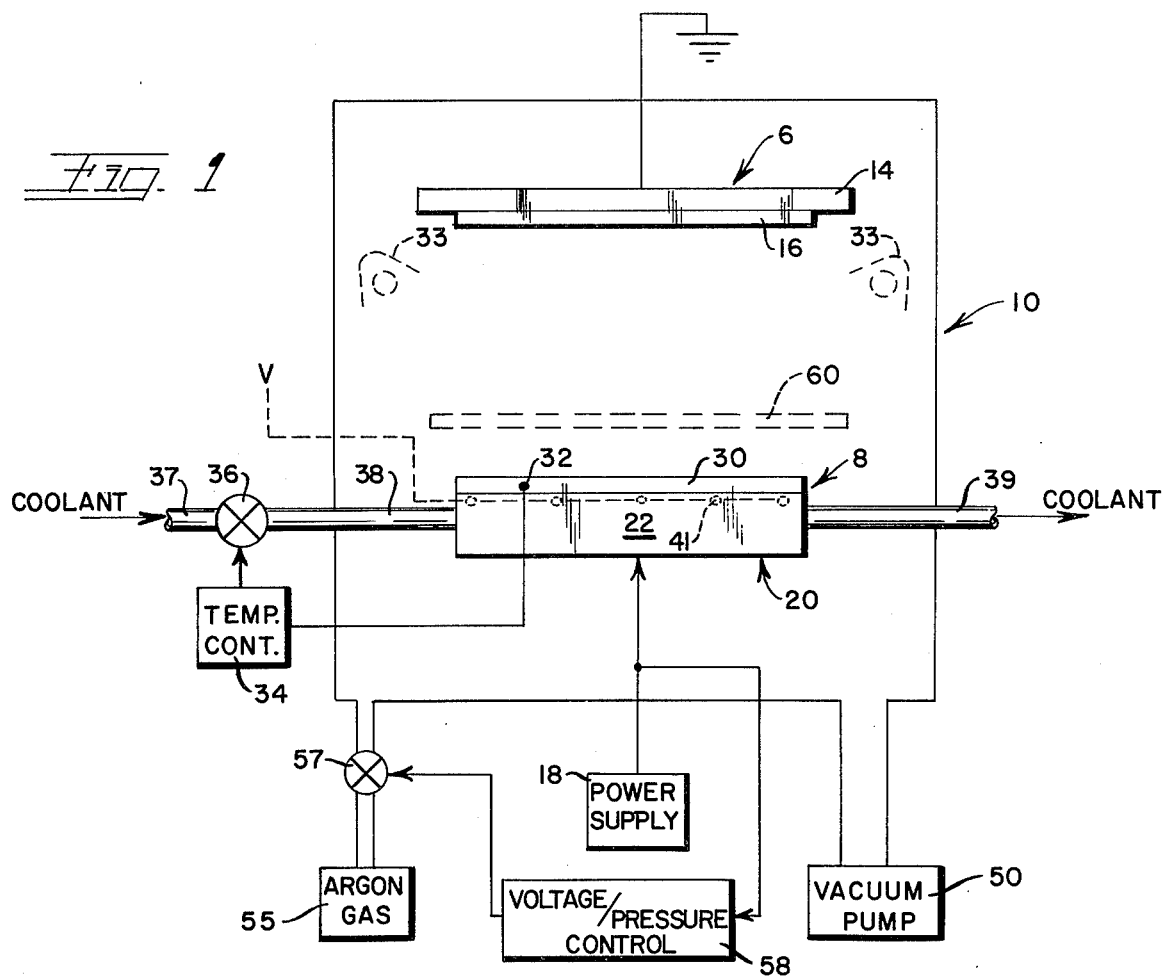
FIG. 1 is a schematic illustration of magnetron sputtering apparatus embodying the invention.

Referring now to the drawings, FIG. 1 schematically illustrates a magnetron sputtering apparatus embodying the invention. The basic sputtering apparatus comprises an anode 6 and a cathode 8, both of which are disposed in a vacuum chamber 10. The anode 6 may be in the form of an electrically conductive plate 14 which, during the sputtering process, is adapted to support and retain a substrate 16 on which a sputtered film is to be deposited. Typically, the anode is connected to ground potential, as shown, and the cathode 8 is connected to a negative voltage from a power supply 18, either DC or RF, which serves to establish an intense electric field between the anode and cathode. It is this electric field which serves to ionize gas molecules in the region between the anode and cathode and thereby produce a gas plasma comprising free electrons and ions.

Figure 2:
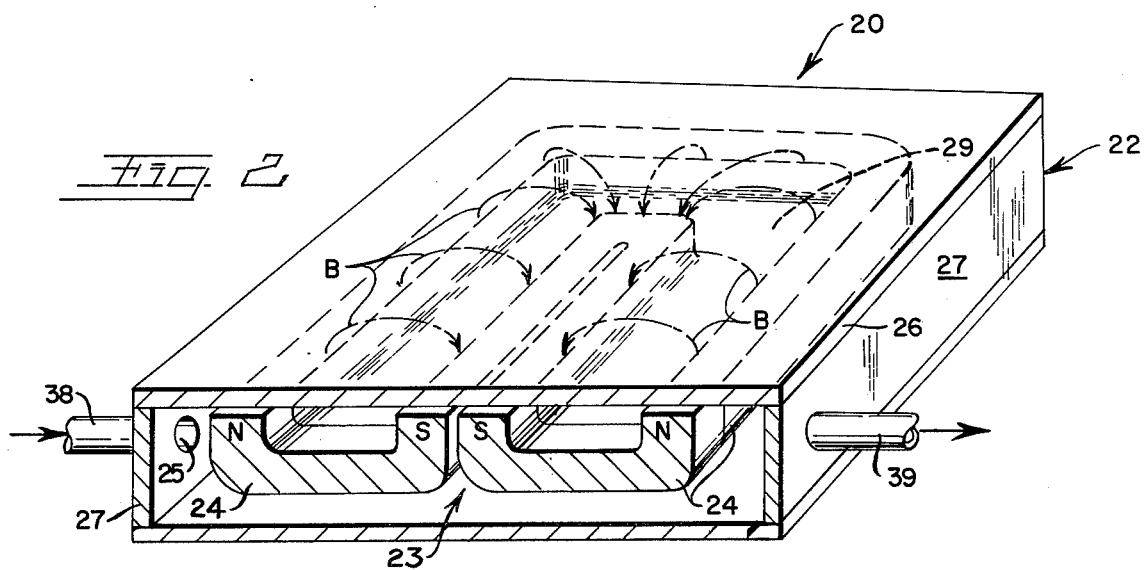
FIG. 2 is a cross-sectional perspective view of a portion of a planar magnetron.
Figure 4:
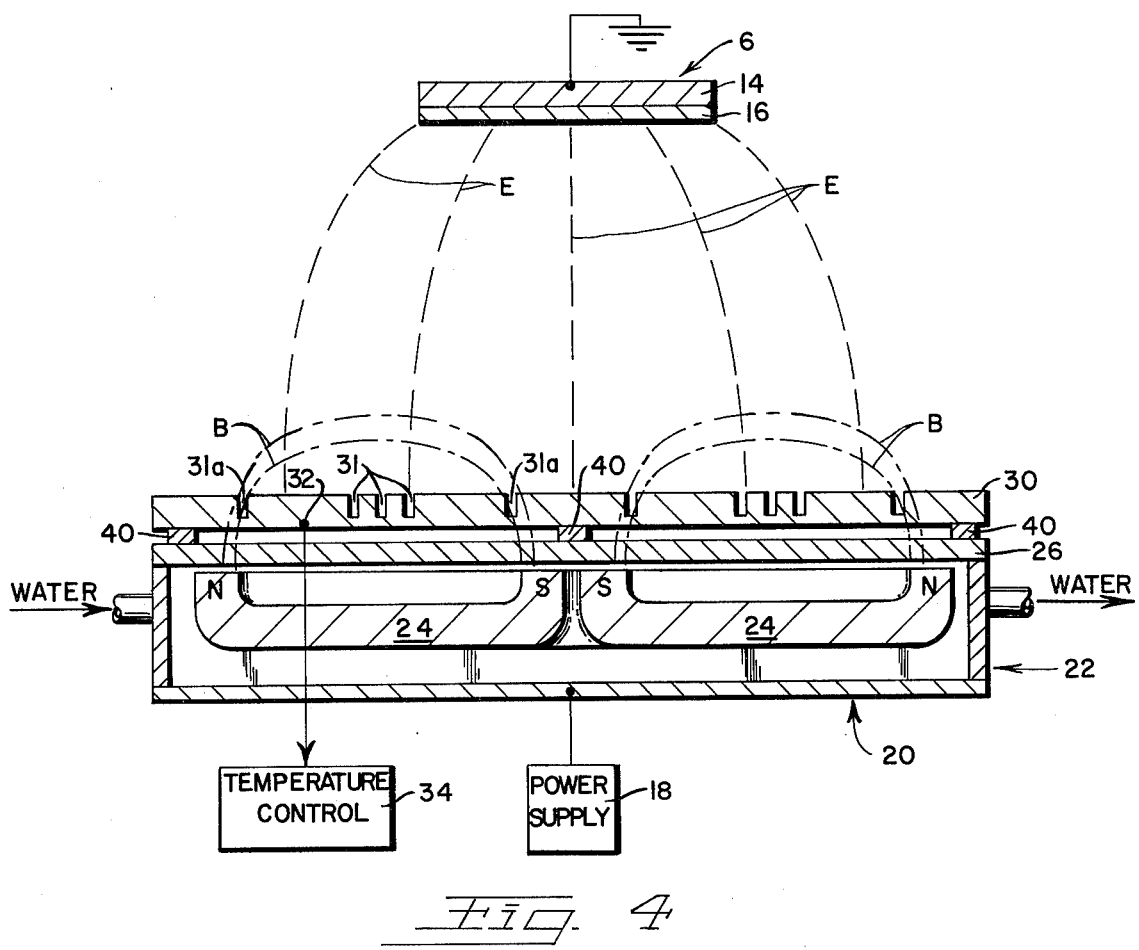
FIG. 4 is a cross-sectional view of the FIG. 3 target positioned in a magnetron sputtering apparatus.

In the specific type of sputtering apparatus shown in FIG. 1, cathode 8 takes the form of a planar magnetron 20 which, as best shown in FIGS. 2 and 4, comprises a non-magnetic (e.g. aluminum or stainless steel) housing 22 in which a closed-loop array 23 of permanent magnets 24 is positioned. Housing 22 is provided with a pair of apertures 25 on opposing side walls 27 to allow a fluid coolant (e.g. water) to flow through. In the cross-sectional perspective view of FIG. 2, approximately one-half of housing 22 and the magnetic array 23 contained thereby has been cut away. Magnetic lines of force B, shown in phantom lines connecting the north and south poles of magnets 24, define a magnetic field 29 above the plane of the magnets, such field resembling a racetrack in shape, approximately one-half of such racetrack being shown in FIG. 2. By virtue of the non-magnetic nature of housing 22 and the proximity of the magnetic pole pieces to top plate 26, the magnetic field lines B project through and above the top plate and extend substantially parallel to the plate surface in the region of the racetrack-shaped magnetic field.

Planar magnetron 20 is adapted to support and retain on the upper surface of top plate 26 a target plate 30 comprising the material to be sputtered. When the target plate 30 is non-magnetic, the magnetron sputtering apparatus operates in the conventional fashion; i.e. magnetic field lines from the magnetron pass through the target and act to densify and confine the gas plasma produced by the electric field between the anode and cathode. This densified plasma, as explained above, enhances the ion bombardment of the target surface and thereby significantly increases the deposition rate of the sputtered material on the substrate 16. When, however, the target plate comprises a magnetic or readily magnetizable material, such as, for example, iron, nickel, cobalt, etc., the target material will act to shunt the magnetic flux through it and thereby prevent the presence of a magnetic field in the space separating the anode and cathode. Thus, the advantages of the planar magnetron cannot be realized.

According to the present invention, it has been found that magnetic target materials can be sputtered using the advantages of the magnetron technique by temporarily substantially reducing the saturation magnetization of the magnetic target (e.g. reducing such magnetization by about 90% of the room temperature value) and by magnetron sputtering the target while in such a state. Preferably, such a temporary demagnetization of the target is effected by heating the target material to its Curie temperature or above, at which temperature the magnetic domains of the material become randomly oriented and the material becomes non-magnetic. While in a substantially demagnetized state, the magnetic lines of force penetrate the target and produce the magnetron effect in the region above the target. Heating of the target to its Curie temperature can be effected in any one of a variety of ways, such as, for example, arranging infrared radiation-emitting lamps 33 (e.g. quartz iodide lamps) inside the vacuum chamber and directing the radiant output of such lamps at the target surface. Alternatively, electrical resistance heaters 41 imbedded in the top plate 26 of the magnetron housing 22 could be used. Such heaters are energized by a variable voltage source V+.

Once the target material has exceeded its Curie point by, say, 10 to 15 degrees centigrade, it is desirable to maintain the target temperature at a substantially constant level. Toward this end, means are provided for continuously monitoring the target temperature and for controlling the target temperature accordingly. To maintain the target temperature substantially constant, a conventional feedback network is provided, such network comprising the combination of a temperature sensor 32, a temperature controller 34 and a valve 36 which controls the flow rate of a fluid coolant 37 (e.g. water) through the housing 22 of the magnetron. Temperature sensor 32 may comprise, for instance, a thermocouple which is arranged in thermal relationship with target plate 30 to sense the temperature of the target directly. Alternatively, an optical/infrared pyrometer could be used to sense the target temperature from outside the vacuum chamber. Sensor 32 provides an output signal representative of target temperature to controller 34, such as any conventional thermostat. The output of the temperature controller is used to control the action of a valve 36 which, in turn, controls the flow rate of the coolant. The coolant passed by valve 36 flows, via conduit 38, into the magnetron housing 22 and, upon exchanging thermal energy with the housing and the magnets disposed therein, leaves the magnetron via conduit 39. Since the target plate 30 is thermally coupled to the upper surface of the magnetron housing, the target temperature varies directly with the temperature of the magnetron. By this temperature feedback arrangement, the target temperature is prevented from reaching a temperature at which it begins to melt or undergo undesired physical or chemical changes. It will be appreciated that the target temperature could also be controlled by using the output of controller 34 to control the electrical energy applied to IR lamps (e.g. lamps 33) or resistance heaters 41, when such devices are used to heat the target plate.

Rather than heat the target material to its Curie point by use of external sources, it is much preferred to use the thermal energy inherent in the sputtering process. To do this, it has been found desirable to initially operate the magnetron sputtering apparatus in a conventional diode mode until the target material has reached a predetermined temperature, and then to switch to the magnetron mode. In order to operate in both the standard diode and magnetron modes, power supply 18 should be capable of providing the high voltage (e.g. 2000 volts) which is required for the diode mode of operation, as well as the high current (e.g. 5.0 amps) which is required for the magnetron mode. Moreover, power supply 18 must have a relatively high impedance (e.g. 1500 ohms) and be capable of suppressing arcing. It should be noted that such a voltage source is not the conventional voltage source which is commonly supplied with either a conventional diode-type sputtering system (which system requires a high voltage, low current supply) or a conventional magnetron system (which system requires a low voltage, high current supply). A suitable high voltage, high current power supply is the Model RDC 3-5000 manufactured by Megavolt Corporation.

When a high voltage (e.g., −2000 volts DC or RF) is applied to the magnetron housing 22 from power supply 18 and the vacuum chamber 10 is filled with an inert gas (e.g. argon) at low pressure (e.g. 25 microns of Hg), the gas is ionized to produce a relatively rarified plasma between the anode and cathode. This is the so-called "diode" mode of operation and the cathode/anode current will stabilize at about 200 milliamps. The gas plasma comprises free electrons and positively charged ions which are accelerated by the applied electric field. Since the cathode is maintained at a negative potential with respect to the anode, the relatively massive positive ions will be attracted toward, and thereby bombard, the target material 30. Such bombardment, of course, increases the target temperature and as the target temperature approaches the Curie point, magnetic flux from the magnetron penetrates the target and densifies the plasma. As indicated above, this plasma densification has the effect of substantially increasing (e.g. by a factor of 10) the rate at which the target is bombarded by ions, as well as the cathode/anode current. As the current increases to several amps, the voltage drops to approximately 700 volts and the system then operates in the conventional magnetron mode. In order to sustain the plasma during the changes in voltage and current, a voltage/pressure control device 58 is used which is capable of monitoring the output voltage of the power supply 18 and controlling the pressure of the working gas (i.e. argon) in the vacuum chamber. Such control is effected via a fast-acting piezoelectric valve 57 which controls the flow of argon gas from a source 55 into the vacuum chamber. Device 58 may be the Plasmaflow instrument made by Vacuum General.

In addition to the high voltage, high current and high output impedance requirements of the power supply, it has been found highly desirable, in order to use the internally-generated heat of the sputtering process to provide the requisite heating of the target material, to space those portions of the target material which are subjected to the magnetron effect (i.e. the aforementioned racetrack area) a small distance away from the upper surface of the magnetron housing 22. Referring to FIG. 4, thin silicon wafers 40, say, for example, 0.020 inches in thickness, are used to support target plate 30 above the magnetron housing 22. These wafers are positioned outside the magnetic racetrack area, along the outer periphery of plate 30, as well as inside the racetrack area, at the central portion of the plate. In addition to functioning as spacers, wafers 40 also serve to conduct heat away from the center and peripheral areas of the target plate during the sputtering process.

In order to facilitate the inital heating of the target plate, it has been found particularly useful to precondition the target plate in the manner described in copending application Ser. No. 059,817 filed concurrently herewith in the name of B. B. Meckel. As disclosed in that application and shown in FIGS. 3 and 4, target plate 30 is preconditioned by cutting or otherwise forming one or more relatively deep and narrow grooves 31 in that portion of the target plate which is positioned juxtaposed to the magnetic racetrack of the magnetron, i.e. that portion of the plate which acts as a shunt to the magnetic flux of the magnetron. If only one groove is cut, it is preferably positioned midway between the pole pieces of magnets 24. If two or more grooves are cut, they are preferably equally spaced and centrally located between the pole pieces (as best shown in the cross-sectional view of FIG. 4 wherein three grooves are shown). Ideally, the path of each groove will conform to the path of the magnetic racetrack 29 and close upon itself so as to be endless. To facilitate cutting of the grooves, however, each endless groove may comprise four, mutually perpendicular, rectilinear grooves, three of which are shown in the cross-sectional view of a target plate shown in FIG. 3, so that the groove path is rectangular in shape. As indicated by the phantom lines in FIG. 3, all of the grooves 31 may extend to the edges of the target plate, cutting through adjacent and other grooves. Preferably, the grooves 31 are closely spaced with narrow (e.g. 0.1 inch) lands 34 between them, and each groove extends to a depth of approximately three-quarters of the thickness of the target plate. Preferably, the grooves have a width no greater than approximately 50% of the depth. Such a geometry prevents substantial sputtering of the bottom of the grooves and thereby assures a relatively long target life. When ions penetrate the groove structure, they tend to impact the side walls at an oblique angle. As a result, a major fraction of the sputtered atoms are ejected in a forward (i.e. downward) direction, thereby adding target material to the bottom of the groove. Those ions which penetrate to the bottom of the groove eject atoms according to a cosine distribution; thus, only those atoms ejected almost straight up can escape, while most are collected at the walls of the groove.

The effect of the grooves is to selectively increase the magnetic reluctance of the main target body, thereby causing some magnetic flux from the magnetron to bridge the gap defined by the groove. The presence of this magnetic flux in the vicinity of the grooves causes a densification of the plasma in this region and an accompanying increase in temperature of the lands 34 which separate the grooves. Being isolated islands where heat input is high, these lands increase in temperature more rapidly than the bulk target. As the temperature of the lands approaches the Curie point of the magnetic target material, the relative magnetic saturation decreases (i.e. the lands become non-magnetic) allowing more magnetic flux to extend into the space above the target. This increase in flux above the target further densifies the plasma, causing an increase in the level of ion bombardment and a further increase in target temperature. An avalanche effect now takes place in which more and more magnetic flux penetrates the target plate resulting in an ever-increasing densification of the plasma which, in turn, leads to high target bombardment rates and high target temperatures. This spiraling cause-and-effect continues until the total magnetic mass between the pole pieces of magnets 24 reaches temperatures greater than the Curie point of the target material and full magnetic field penetration occurs above the target surface. At this time, the aforedescribed temperature feedback network operates to maintain the target temperature at a desired level, say, 15 to 25 degrees C. above the Curie temperature.

From the drawings, it will be appreciated that lands 34 are beneficial from the standpoint that they will become heated much more rapidly than the bulk of the target. Moreover, the region directly below each groove defines a constricted path through which most of the heat is conducted away. The heat transfer process in this constricted region acts to enhance the temperature build-up of the lands and reduces the shunting of magnetic flux.

In addition to forming one or more grooves in the target plate at positions which are centrally located with respect to the poles of magnets 24, it is also desirable to cut grooves 31a directly above the inside edges of the magnetic poles of magnets 24. Such grooves (shown in FIGS. 3 and 4) serve to maintain the temperature of the target mass directly above each of the poles at a temperature below the Curie point so that this area acts as an extended pole tip of each magnet.

Figure 5:
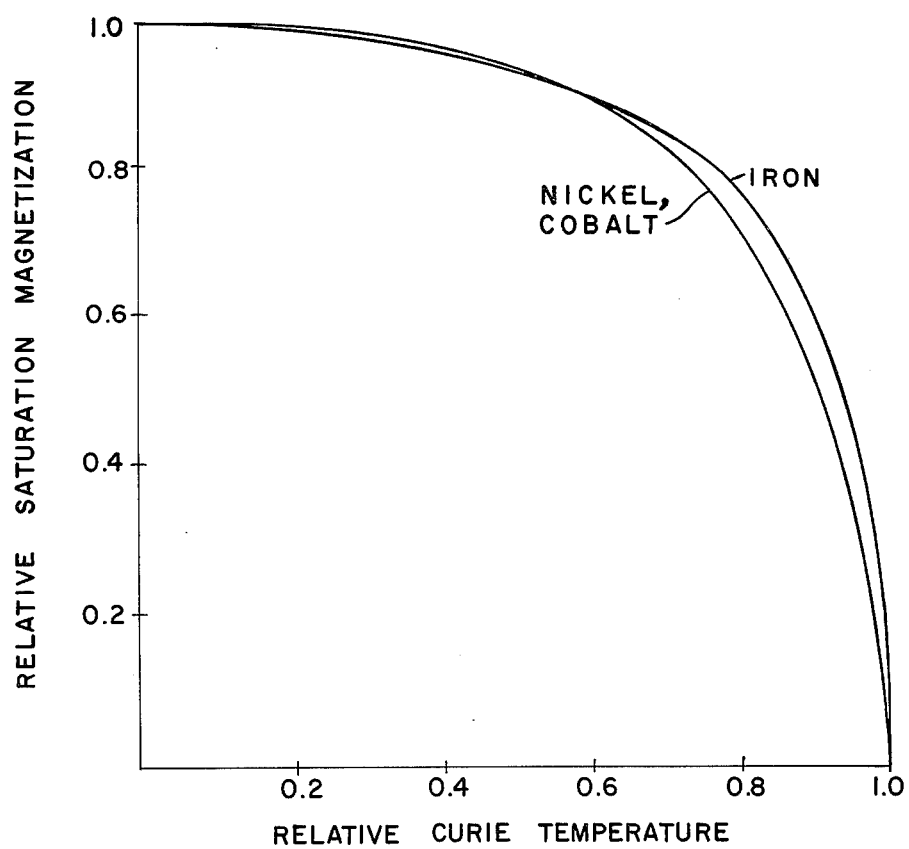
FIG. 5 is a graph illustrating the temperature dependence of the saturation magnetization of iron, cobalt and nickel.

In FIG. 5 the temperature dependence of the saturation magnetization of iron, cobalt and nickel is shown. Note, when the temperature of the material approximates 90% of its Curie temperature, the relative saturation magnetization drops to about 50% of its maximum value. Thus, it is apparent that even before the target has reached the Curie temperature per se, its saturation magnetization has dropped substantially from its room temperature value, thereby releasing more magnetic flux lines from the magnetic target into the plasma region.

Briefly, the operation of the magnetron sputtering apparatus shown in FIGS. 1 and 4 is as follows. A magnetic target plate 30 is clamped to the upper surface of the water cooled magnetron 20. Heat conductive spacers 40, are positioned between the target plate 30 and the magnetron to space the aforementioned magnetic racetrack region of the target a slight distance from the magnetron surface. A vacuum pump 50 is energized to evacuate vacuum chamber 10 to a pressure of about $10^{-3}$ microns. The chamber is then back-filled with argon gas from source 55 via valve 57 to produce a pressure of about 25 microns. The cathode 8 is then connected to the negative terminal of the high voltage, high current power supply 18 which applies approximately $-2000$ volts between the anode 6 (which is grounded) and the cathode, thereby producing an electric field E, as shown in FIG. 4. Initially, that is, until target plate experience a substantial increase in temperature, the sputtering apparatus operates in the standard diode mode since the magnetic field of the magnetron is shunted through the target plate. In the diode mode, a relatively rarified plasma discharge is produced between the anode and cathode, and the plasma-densifying effect of the magnetron is not felt.

When operating in the diode mode with an anode/cathode spacing of about 5 cm. and an argon gas pressure of about 25 microns, the current density is about 1.5 milliamps/cm$^2$. The operation of the system is controlled by the voltage/pressure control 58 which functions, as described above, to regulate, via the fast-acting piezoelectric valve 57, the pressure of the working gas. Upon setting the discharge voltage at a desired level, voltage sensor 58 maintains the argon gas pressure at the level required to maintain that voltage. Thus, when the system is initially activated, the discharge between anode and cathode is stabilized in a glow discharge, capacitance-type mode which is common to the diode sputtering system when the spacing between anode and cathode is relatively large. During this period, the discharge acts to heat the entire target surface, a desirable clean-up and outgassing process. A movable shutter 60 is positioned between the anode and cathode to prevent the oxidized surface layer of the target from being sputtered onto the substrate during this clean-up and outgassing process. Since the shutter is electrically grounded, it behaves as the anode and, owing to its closer proximity to the cathode, a plasma discharge can be sustained at a working gas pressure of about 20 to 30 microns. When the shutter is removed, the working gas pressure must be increased to about 100 to 200 microns.

During the period of target heat-up, the voltage and gas pressure are constantly monitored and controlled by voltage/pressure controller 58 and, as the magnetic field above the target increases and the plasma becomes more intense, the voltage and pressure characteristics re-adjust. At a pressure of about 2 microns, the current reaches the maximum level, as set by the power supply, and the entire racetrack region of the target is covered with the concentrated bright glow which is characteristic of normal planar magnetron operation.

From the foregoing it should be apparent that the magnetron sputtering method and apparatus of the invention are useful in the formation of magnetic films of virtually any magnetic material, i.e. any material exhibiting magnetic properties at ambient temperature, typically room temperature. The following example, therefore, should be considered as illustrative of the invention and not limiting in any way to the particular material discussed.

EXAMPLE

Figure 3:
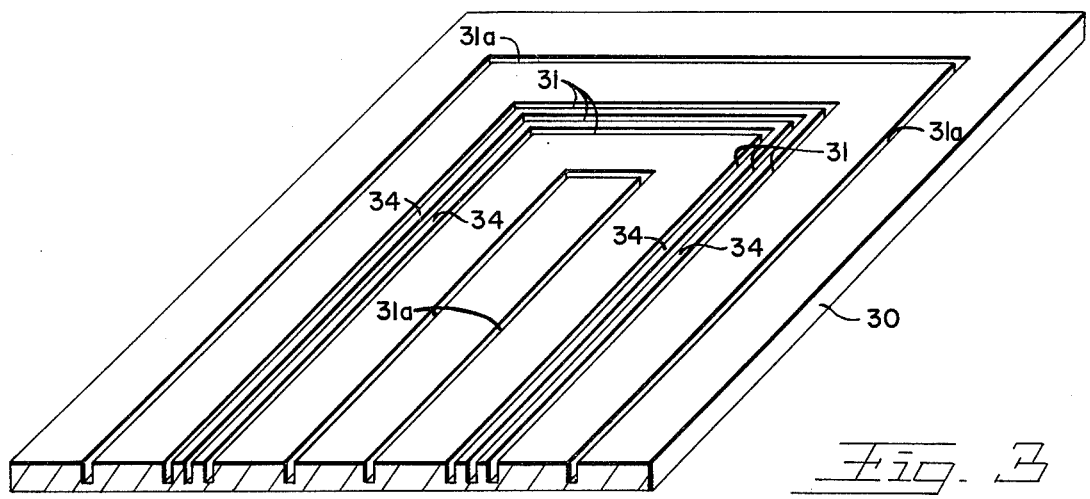
FIG. 3 is a perspective cross-sectional view of a preferred target configuration.

A ferromagnetic target was prepared from Spinalloy, a trademark of Spin Physics, Inc. used to identify a ferromagnetic alloy comprised of about 85% Fe, 10% Si and 5% Al. Spinalloy exhibits magnetic properties up to its Curie temperature of approximately 570° C., and the object of this work was to magnetron-sputter deposit a thin film of Spinalloy onto an aluminum substrate. The Spinalloy was first formed into a target of rectangular shape, such target being 0.25 inches thick, and having a length and width sufficient to totally cover the surface of the planar magnetron. In this example, the plate was 5×12 inches. The target was preconditioned by cutting a plurality of spaced rectilinear grooves in the surface of the target, as shown in FIG. 3, such grooves being positioned so that, after the target was mounted on the magnetron, the grooves were positioned between the pole pieces of a portion of the ring of magnets comprising the planar magnetron. The grooves were cut to a depth of approximately 0.12 inches and had a width of 0.06 inches. The Spinalloy target was positioned atop the planar magnetron component of the sputtering apparatus shown schematically in FIG. 4. Thin silicon spacers were used to support the target approximately 0.02 inches from the surface of the magnetron. The spacers were positioned outside the region through which the magnetic lines of force were expected to penetrate the target material upon being heated in accordance with the invention. The magnetron, together with the aluminum substrate, were enclosed in a vacuum chamber which was subsequently evacuated to about $10^{-6}$ mm.Hg. The chamber was backfilled with argon by the action of a piezoelectric needle valve controlled by a Plasmaflow instrument made by Vacuum General. The Plasmaflow instrument controlled the argon pressure so that the desired preset discharge voltage was maintained. The starting diode mode pressure was between about 100 and $150 \times 10^{-3}$ mm.Hg. argon. The initial voltage setting was such as to produce a 700 volt potential between anode and cathode. When this voltage was applied between anode and cathode, a plasma discharge took place between the anode and cathode and the target began to heat. To accelerate this heating process, the applied voltage was then increased slowly over a time period of about 3 to 5 minutes to approximately 1500 volts. This had the effect of increasing the anode/cathode current which in turn increased the level of ion bombardment of the target surface. As the target temperature approached its Curie point, the plasma discharge intensified, first in the vicinity of the cut grooves. The pressure of the argon gas within the vacuum chamber was then reduced by the Plasmaflow instrument to a working pressure of about 0.8 to $2.0 \times 10^{-3}$ mm.Hg. Shortly thereafter, a dense plasma covered the Spinalloy target in the vicinity directly above the magnetic assembly of the magnetron. The water supply which cools the magnetron was then turned on and was adjusted by a feedback network to maintain the temperature of the target in the vicinity of the plasma at a temperature between 580° and 600° C., i.e. a temperature well above the Curie temperature of the target, yet not so high as to produce undesirable heating effects, e.g. target melt-down. The sputtering of the target was allowed to continue for several hours, until a magnetic film of Spinalloy approximately 0.005 inches thick was deposited on the aluminum substrate. Upon cooling the substrate to room temperature and removing it from the vacuum chamber, it was determined that the magnetic properties of the sputter-deposited film was substantially identical to that of the original target. Further, it was determined that the stoichiometry of the deposited film was not substantially altered by the sputtering process.

While the invention is described as being particularly advantageous in connection with the magnetron sputtering magnetic target material, it will be appreciated that it is also useful in sputtering of any material whose temperature, during the sputtering process, must be elevated and maintained at an elevated level.

The invention has been described in detail with particular reference to certain preferred embodiments thereof, but it will be understood that variations and modifications can be effected within the spirit and scope of the invention.

What is claimed is:

1. An improved method for magnetron sputtering a magnetic target to produce a magnetic film having substantially the same magnetic properties as the magnetic target wherein the improvement comprises heating the magnetic target, by means of a heater capable of heating said target independent of said sputtering method, to a temperature substantially equal to or above its Curie temperature to render said target non-magnetic, and magnetron sputtering said target while in a non-magnetic state to produce a magnetic film on a substrate spaced from said target.

2. The method according to claim 1 wherein said heater of said heating step comprises means for irradiating said target with radiant energy from an infrared radiation-emitting lamp.

3. The method according to claim 1 wherein said heater of said heating step comprises means for energizing electrical resistance heaters positioned in thermal contact with said target.

4. The method according to claims 1, 2, or 3 wherein said target is supported by a magnetron housing during said heating step and wherein said method further comprises the step of thermally isolating selected portions of the target material from said housing to effect a reduction in the rate of thermal energy dissipation therefrom.

5. In apparatus for magnetron sputtering a magnetic target to produce a magnetic film on a substrate spaced from such target, said apparatus comprising magnetic means for producing magentic flux, a magnetic target and means for supporting the magnetic target in a position in which the target acts as a shunt to said magnetic flux, means for producing a gas plasma in the vicinity of the supported target and for causing gas ions from said plasma to bombard the supported target and thereby cause particles of the target to become sputtered onto the substrate, the improvement comprising:

means for heating said supported target independent of the heat produced by said apparatus while sputtering the material of said supported target, thereby to reduce the saturation magnetization of said supported magnetic target so that at least a portion of said magnetic flux penetrates the magnetic target, extending into and thereby densifying said plasma, whereby the rate at which the target is sputtered onto the substrate is enhanced.

6. The apparatus as defined in claim 5 wherein said heating means is means for heating said supported magnetic target to a temperature near or above its Curie temperature.

7. The apparatus as defined in claim 6 wherein said heating means comprises an infrared radiation-emitting lamp.

8. The apparatus as defined in claim 6 wherein said heating means comprises an electrical resistance heater positioned in thermal communication with said supported magnetic target.

9. The apparatus as defined in claim 6 further comprising means for isolating thermal energy in selected portions of said supported target from said support means.

10. Apparatus for magnetron sputtering a magnetic target plate to produce a magnetic film on a substrate spaced therefrom, said apparatus comprising:

(a) a magnetron comprising a non-magnetic housing having magnetic means positioned therein, said magnetic means being adapted to produce magnetic flux at selected regions outside said housing;

(b) means for controlling the temperature of said housing;

(c) a magnetic target plate;

(d) thermally conductive spacer means for thermally coupling selected portions of said magnetic target plate with said housing, said spacer means being effective to thermally isolate other portions of the target plate from said housing, such other portions being arranged in said selected regions of the magnetic flux produced by said magnetic means;

(e) means for producing a gas plasma in the vicinity of said target plate thermally coupled with said housing and for attracting gas ions from said plasma toward such target plate, whereby the target plate is subjected to ion bombardment which causes at least the other portions of the target plate to be heated to a temperature substantially equal to or above the Curie temperature of the magnetic target plate, whereby said other portions of the target plate are rendered non-magnetic, allowing said magnetic flux to pass through the plate to densify said plasma;

(f) means for monitoring the temperature of said target plate thermally coupled with said housing and for producing a signal representative of the target plate temperature; and (g) means responsive to said signal and operatively coupled to said temperature controlling means for maintaining said other portions of said target plate thermally coupled with said housing at a temperature equal to or in excess of said Curie temperature.

* * * * *